United States Patent
Moriyama et al.

(10) Patent No.: US 7,020,010 B2
(45) Date of Patent: Mar. 28, 2006

(54) MAGNETIC STORAGE APPARATUS USING FERROMAGNETIC TUNNEL JUNCTION DEVICES

(75) Inventors: Katsutoshi Moriyama, Saga (JP); Hironobu Mori, Nagasaki (JP); Nobumichi Okazaki, Kanagawa (JP)

(73) Assignee: Sony Corporation, (JP)

( * ) Notice: Subject to any disclaimer, the term of this patent is extended or adjusted under 35 U.S.C. 154(b) by 32 days.

(21) Appl. No.: 10/503,658

(22) PCT Filed: Feb. 7, 2003

(86) PCT No.: PCT/JP03/01348

§ 371 (c)(1),
(2), (4) Date: Aug. 6, 2004

(87) PCT Pub. No.: WO03/067601

PCT Pub. Date: Aug. 14, 2003

(65) Prior Publication Data

US 2005/0105347 A1    May 19, 2005

(30) Foreign Application Priority Data

Feb. 8, 2002   (JP) .............................. 2002-031986

(51) Int. Cl.
*G11C 11/00* (2006.01)
(52) U.S. Cl. ....................................... 365/158; 365/173
(58) Field of Classification Search ................ 365/158, 365/173
See application file for complete search history.

(56) References Cited

U.S. PATENT DOCUMENTS

| 6,365,286 B1 * | 4/2002 | Inomata et al. | 428/811.1 |
| 6,549,455 B1 * | 4/2003 | Yamada | 365/158 |
| 6,683,802 B1 * | 1/2004 | Katoh | 365/145 |
| 6,888,742 B1 * | 5/2005 | Nguyen et al. | 365/158 |

FOREIGN PATENT DOCUMENTS

JP  2002-197851 A  7/2002

OTHER PUBLICATIONS

International Search Report dated May 27, 2003.

* cited by examiner

*Primary Examiner*—Michael Tran
(74) *Attorney, Agent, or Firm*—Rader, Fishman & Grauer PLLC; Ronald P. Kananen

(57) ABSTRACT

A magnetic storage apparatus provided using ferromagnetic tunnel junction devices is constituted by forming the ferromagnetic tunnel junction device by laminating a fixed magnetization layer and a free magnetization layer on top and back surfaces of a tunnel barrier layer, respectively, wiring word lines in the magnetization direction of the fixed magnetization layer of the ferromagnetic tunnel junction device, and wiring bit lines in the direction orthogonal to the magnetization direction of the fixed magnetization layer of the ferromagnetic tunnel junction device, wherein two different memory states can be written in the ferromagnetic tunnel junction device by inverting the direction of the current flowing through the bit lines. At the time of writing in the ferromagnetic tunnel junction device, the direction of the current flowing through the word line is inverted in the same direction as or the opposite direction to the magnetization direction of the fixed magnetization layer.

2 Claims, 6 Drawing Sheets

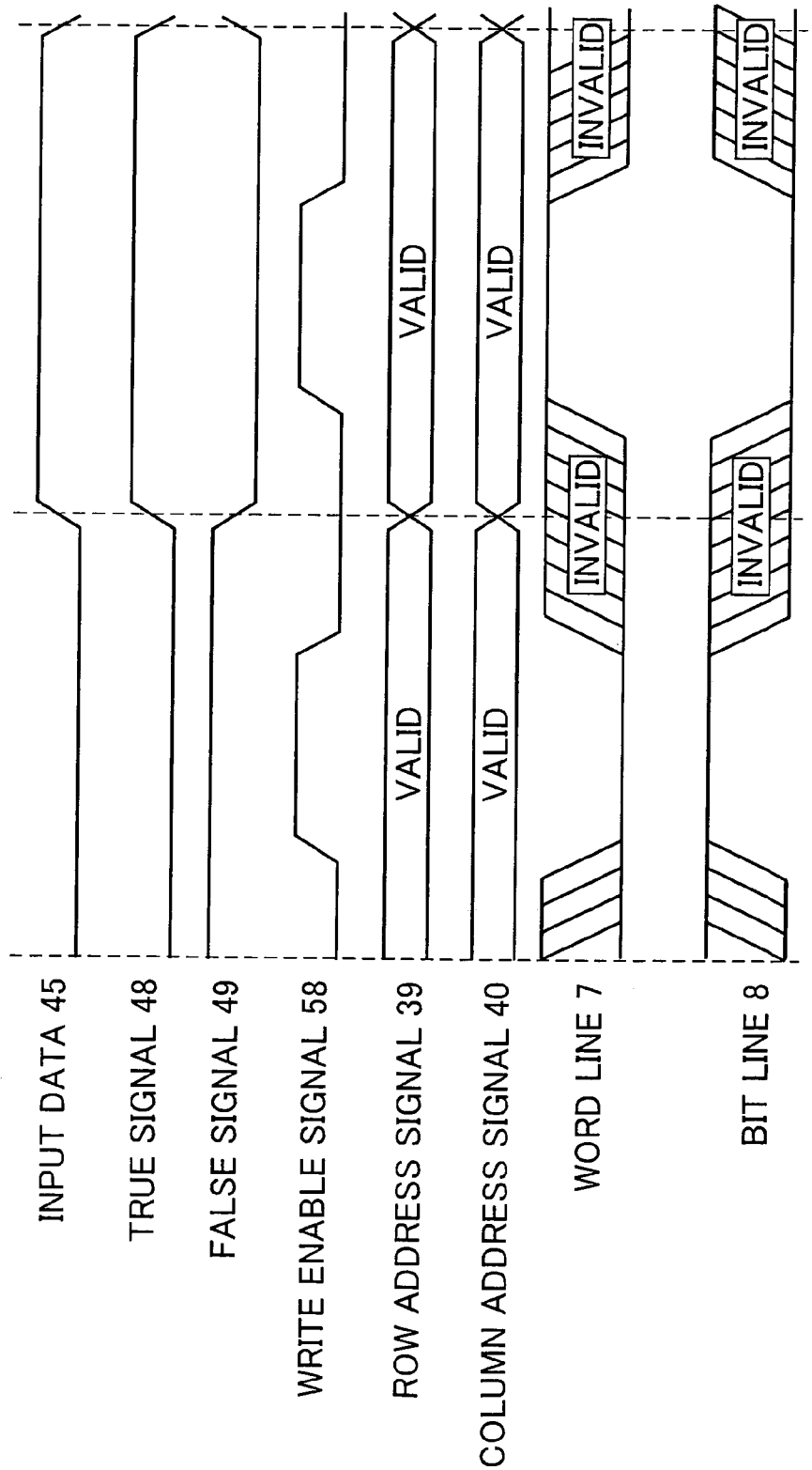

MAGNETIC STORAGE APPARATUS USING FERROMAGNETIC TUNNEL JUNCTION DEVICES

FIELD OF TECHNOLOGY

The present invention relates to a magnetic storage apparatus using ferromagnetic tunnel junction devices.

BACKGROUND TECHNOLOGY

In recent years, as a storage apparatus for a computer, it is desired that one capable of writing at a high speed and unlimited number of times and also is a nonvolatile type.

And a magnetic storage apparatus using ferromagnetic tunnel junction devices is attracting attention as a storage apparatus which is provided with the above mentioned functions.

Such a ferromagnetic tunnel junction device is constituted by laminating a pair of ferromagnetic thin films on both the top and back surfaces of an insulation thin film. One of the ferromagnetic thin films is called a fixed magnetization layer because it is always magnetized in a fixed direction. Here, on the other hand, the other ferromagnetic thin film is called as a free magnetization layer because it is magnetized in the same direction (parallel direction) as the magnetization direction of the fixed magnetization layer or it is inverted in the opposite direction (anti-parallel direction) depending on the memory state of the ferromagnetic tunnel junction device. Moreover, the insulation is called a tunnel barrier layer because it causes a tunnel current when voltage is applied between the fixed magnetization layer and the free magnetization layer.

The ferromagnetic tunnel junction device has a structure which stably holds two states of different magnetization direction, that is, the state in which the free magnetization layer is magnetized in the same direction as that of the fixed magnetization layer or the state in which it is magnetized in the opposite magnetization direction to that of the fixed magnetization layer by the action of the magnetic force of the fixed magnetization layer, thereby storing the two states of different magnetization direction. By defining these two different states of magnetization direction as two different memory states, that is, "0" and "1", it is possible to store two different memory states.

Accordingly, the ferromagnetic tunnel junction device is capable of writing two different memory states externally by magnetizing the free magnetization layer in the same magnetization direction as or the opposite magnetization direction to that of the fixed magnetization layer. It is to be noted that the memory states are written in the ferromagnetic tunnel junction device can be read out by utilizing the giant magneto resistance effect in which conductance in the tunnel barrier layer differs depending on the magnetization direction of the free magnetization layer.

Furthermore, the magnetic storage apparatus utilizing the ferromagnetic tunnel junction devices is formed with a plurality of first wiring lines on a semiconductor substrate in the magnetization direction of the fixed magnetization layers of the ferromagnetic tunnel junction devices, a plurality of second wiring lines on the semiconductor substrate in the orthogonal direction to the magnetization direction of the fixed magnetization layers of the ferromagnetic tunnel junction devices. The ferromagnetic tunnel junction devices are disposed at cross points of the first wiring and the second wiring, which are formed in a lattice-like pattern. Here, in conformity to conventional memory devices, such as DRAMs, SRAMs and the like, the first wiring is called a word line while the second wiring is called a bit line.

In the magnetic storage apparatus using ferromagnetic tunnel junction devices that is constituted as above, in order to perform a storage operation in the ferromagnetic tunnel junction device, a current is caused to flow through the word line so as to generate a word line magnetic force in the orthogonal direction to the direction of the current flow, and also a current is caused to flow through the bit line so as to generate a bit line magnetic force in the orthogonal direction to the direction of the current flow. As a result, a combined magnetic force of the word line magnetic force and the bit line magnetic force acts upon the free magnetization layer, and the free magnetization layer is then magnetized in the same direction as or the opposite direction to the magnetization direction of the fixed magnetization layer. In this manner, either one of the two states of magnetization direction generates in the free magnetization layer. Such state of magnetization direction is stably held by the action of the magnetic force of the fixed magnetization layer, thereby performing the storage operation in the ferromagnetic tunnel junction device.

Conventionally, in the case of writing a desired memory state in the ferromagnetic tunnel junction device, the current flowing through the word line is maintained always in the fixed direction so as to generate the word line magnetic force always in the fixed direction, and under this condition, only the bit line magnetic force is inverted by inverting the direction of current flowing through the bit line, thereby changing the magnetization direction of the combined magnetic force of the word line magnetic force and the bit line magnetic force. By the action of the combined magnetic force upon the free magnetization layer, the magnetization direction of the free magnetization layer is inverted, thereby writing a desired memory state in the ferromagnetic tunnel junction device.

However, in the aforementioned conventional magnetic storage apparatus using ferromagnetic tunnel junction devices, at the time of writing a desired memory state in the ferromagnetic tunnel junction device, the direction of the current flowing through the bit line is inverted while the direction of the current flowing through the word line remains always in the fixed direction, so that the current flows through the word line always in the fixed direction at the time of writing in the ferromagnetic tunnel junction device and, therefore, a constant potential difference is always generated between the word line and the peripheral area of the semiconductor substrate.

Moreover, in the magnetic storage apparatus, since it is necessary to generate a magnetic force by causing a current to flow through the word line, a current as large as several tens of milliamperes (mA) must be flowed through the word line.

Consequently, electromigration is occurs due to the current flowing through the word line in the fixed direction and potential difference generated between the word line and peripheral area thereof and separates out a metal or metals consisting of the word line, thereby causing a short-circuit between the word lines, damage of the word lines themselves, etc. Accordingly, there maybe a fear of incurring troubles in the magnetic storage apparatus.

A possible solution to prevent such electromigration from occurring is to improve the resistance to electromigration of the word lines by increasing the width of the word lines, however, which accompanies another problem of increasing the size of the magnetic storage apparatus due to the increased width of the word lines.

It is, therefore, an object of the present invention is to provide a magnetic storage apparatus with improved resistance to electromigration of the word lines without increasing the width of the word lines.

DISCLOSURE OF INVENTION

For this end, in the present invention, the magnetic storage apparatus using ferromagnetic tunnel junction devices is configured by forming the ferromagnetic tunnel junction device by laminating a fixed magnetization layer and a free magnetization layer by way of a tunnel barrier layer, disposing word lines in the magnetization direction of the fixed magnetization layer of the ferromagnetic tunnel junction devices, and disposing bit lines in the orthogonal direction to the magnetization direction of the fixed magnetize ion layer of the ferromagnetic tunnel junction devices, in such a manner to write two different memory states in the ferromagnetic tunnel junction devices by inverting the current flowing through the bit lines, wherein the direction of the current flowing through the word lines is inverted in the same direction as or the opposite direction to the magnetization direction of the fixed magnetization layer, at the time of writing in the ferromagnetic tunnel junction devices.

Inversion of the current flowing through the word lines is performed at every time of writing in the ferromagnetic tunnel junction devices.

By inverting the direction of the current flowing through not only the bit lines but also the word lines at the time of writing in the ferromagnetic tunnel junction devices, the direction of the current flowing through the word lines is not always fixed but is inverted with time, thereby changing the current flowing through the word lines to a quasi-alternating current.

By alternating the current flowing through the word lines, the potential difference, which generates between the word line and the peripheral semiconductor substrate, is reversed with time, thereby preventing electromigration due to an always constant potential difference from occurring, improving resistance to electromigration without increasing the width of the word lines that increases the size of the magnetic storage apparatus, and extending the lifetime by preventing troubles of the magnetic storage apparatus.

Particularly, in the case of inverting the direction of the current flowing through the word lines at every time of writing in the ferromagnetic tunnel junction devices, it is possible to minimize the time to generate a constant potential difference between the word line and the peripheral semiconductor substrate, thereby more effectively preventing electromigration from occurring and further improving resistance to electromigration.

BRIEF DESCRIPTION OF THE DRAWINGS

FIG. 10 is a flowchart at the time of writing in a ferromagnetic tunnel junction device.

BEST MODE FOR CARRYING OUT THE INVENTION

In what follows, a concrete embodiment of the present invention will be described by reference to the drawings.

The magnetic storage apparatus 1 according to the present invention uses ferromagnetic tunnel junction devices 2 as storage elements each of which stores two different memory states, for example, either "0" or "1".

Figure 1:
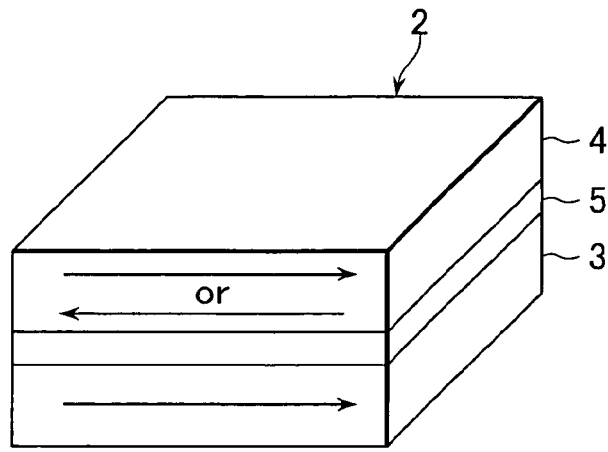
FIG. 1 is an illustration showing a ferromagnetic tunnel junction device.

Firstly, describing the structure of the ferromagnetic tunnel junction device 2, as shown in FIG. 1, the ferromagnetic tunnel junction device 2 is made of a lamination in which a thin film fixed magnetization layer 3 and a thin film free magnetization layer 4 are laminated on top and back surfaces of a tunnel barrier layer 5.

It is to be noted here that the fixed magnetization layer 3 is made of a ferromagnetic material (for example, CoFe) and is magnetized always in a fixed direction. On the other hand, the free magnetization layer 4 is made of a ferromagnetic material (for example, NiFe) and magnetized in the same direction (parallel direction) as the magnetization direction of the fixed magnetization layer 3 or an opposite direction (anti-parallel direction). Furthermore, the tunnel barrier layer 5 is made of an insulation material (for example, $Al_2O_3$).

Figure 2:
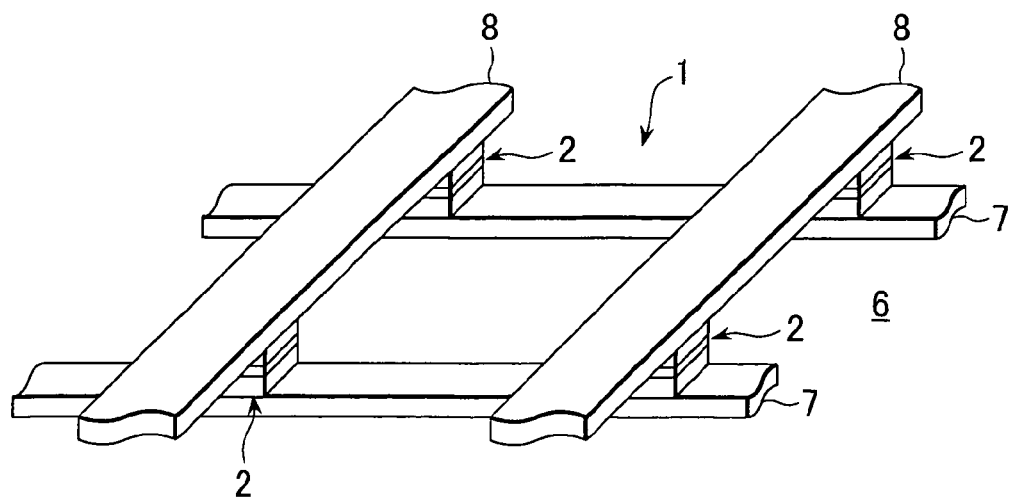
FIG. 2 is an illustration showing a magnetic storage apparatus using ferromagnetic tunnel junction devices.

Next, describing the structure of the magnetic storage apparatus 1 using ferromagnetic tunnel junction devices 2. As shown in FIG. 2, in the magnetic storage apparatus 1, a plurality of word lines 7 is formed on a semiconductor substrate 6 in the direction of the magnetization direction of the fixed magnetization layer 3 of the ferromagnetic tunnel junction device 2 while a plurality of bit lines 8 is formed on the semiconductor substrate 6 in the orthogonal direction to the magnetization direction of the fixed magnetization layer 3 of the ferromagnetic tunnel junction device 2, and then, a plurality of ferromagnetic tunnel junction devices 2 disposed at cross points of the word lines 7 and the bit lines 8 which are formed in a lattice-like pattern. It is to be noted that only the structure of the magnetic storage apparatus 1 necessary for writing the memory states in the ferromagnetic tunnel junction device 2 is described in the description and the structure for reading out the stored state written in the ferromagnetic tunnel junction device 2 is abbreviated.

Next, a principle of writing the two different memory states in the ferromagnetic tunnel junction devices 2 in the magnetic storage apparatus 1 having the above structure will be described. A description will be made on the assumption that magnetization of the free magnetization layer 4 of the ferromagnetic tunnel junction device 2 in the same direction as the magnetization direction of the fixed magnetization layer 3 corresponds to "0" while magnetization of the free magnetization layer 4 in the opposite direction to the magnetization direction of the fixed magnetization layer 3 corresponds to "1". It is to be noted, however, that the correspondence between the magnetization directions of the free magnetization layer 4 and the memory states may be the reversed relation to the above.

Writing either an "0" or "1" memory state in the ferromagnetic tunnel junction device 2 is, in other words, magnetizing the free magnetization layer 4 in the same direction as or the opposite direction to the magnetization direction of the fixed magnetization layer 3.

And, magnetization of the free magnetization layer 4 of the ferromagnetic tunnel junction device 2 is carried out by a combined magnetic force 11 of a word line magnetic force 9 generated by applying a current to the word line 7 and a bit line magnetic force 10 generated by applying a current to the bit line 8 so as to act upon the free magnetization layer 4.

Figure 3:
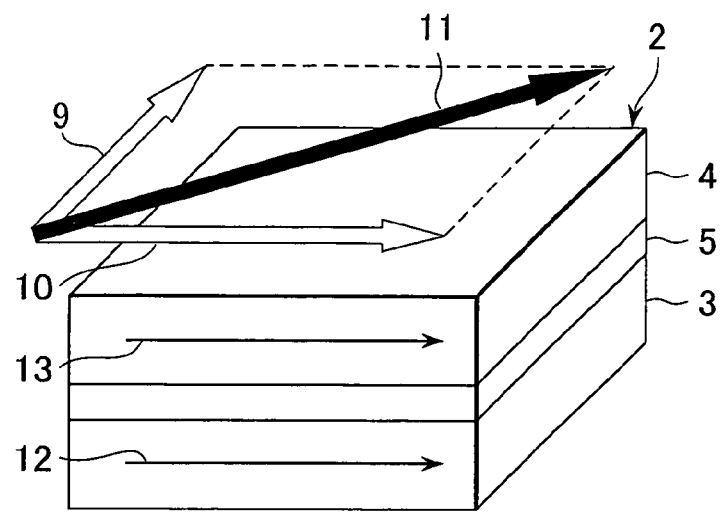
FIG. 3 is an illustration showing a memory state of a ferromagnetic tunnel junction device.

By causing the current to flow through the word line 7, for example, from the right to left, the word line magnetic force 9 is generated in the orthogonal direction to the word line 7 of the ferromagnetic tunnel junction device 2, which is the direction from the near side to the far side in the drawing. On the other hand, by causing the current to flow through the bit line 8 from the near side to the far side, the bit line magnetic force 10 is generated from the left to right direction, which is the orthogonal direction to the direction of the current flowing through the bit line 8. Accordingly, as shown in FIG. 3, the combined magnetic force 11 diagonally toward the far right side, which is constituted of the word line magnetic force 9 and the bit line magnetic force 10, acts upon the free magnetization layer 4. Such combined magnetic force 11 is stably held inside the free magnetization layer 4 as a magnetic force 13, which is in the same direction as the magnetization direction of the fixed magnetization layer 3, by a magnetic force 12 in the fixed magnetization layer 3. And, as described hereinabove, in case if the magnetization direction in the free magnetization layer 4 is the same direction as the magnetization direction of the fixed magnetization layer 3, the ferromagnetic tunnel junction device 2 is considered to store the memory state "0".

This will be described by reference to FIG. 4, which is an illustration of the memory state. The illustration of the memory state illustrates that the memory state will be either "0" or "1" depending on the direction of the combined magnetic force 11 of the word line magnetic force 9 and the bit line magnetic force 10. In the illustration of the memory state, a horizontal axis represents the magnitude of the word line magnetic force 9 and a leftward current flow from the right to left through the word line 7 is defined as a positive direction. On the other hand, a vertical axis represents the magnitude of the bit line magnetic force 10 and a coming current flow from the far side to the near side through the bit line 8 is defined as a positive direction. It indicates that the memory state is "0" if the combined magnetic force 11 is directed upwardly with respect to the horizontal axis, while the memory state is "1" if the combined magnetic force 11 is directed downwardly with respect to the horizontal axis. It is to be noted that a substantially diamond shaped area surrounded by 4 arcs near the center portion in the illustration of the memory state is a non-inverting area. If the combined magnetic force 11 remains within the non-inverting area, the combined magnetic force 11 is too weak to magnetize the free magnetization layer 4 effectively.

Figure 4:
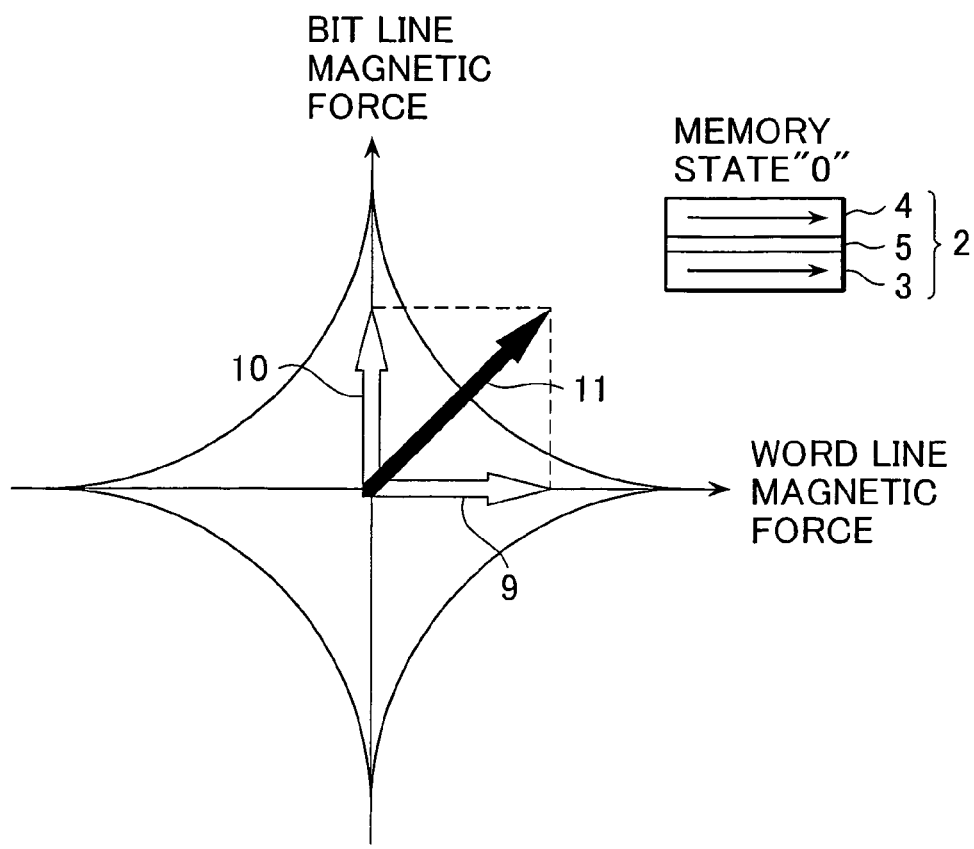
FIG. 4 is an illustration of a memory state (in a case when a combined magnetic force is directed upper rightward).

As shown in FIG. 4, when the current is caused to flow from the right to left through the word line 7, the magnetization direction of the word line magnetic force 9 is positive. On the other hand, when the current is caused to flow from the far side to the near side through the bit line 8, the magnetization direction of the bit line magnetic force 10 is positive. Since the positive word line magnetic force 9 and the positive bit line magnetic force 10 make the direction of the combined magnetic force 11 upwardly, the memory state in the ferromagnetic tunnel junction device 2 is "0".

Figure 5:
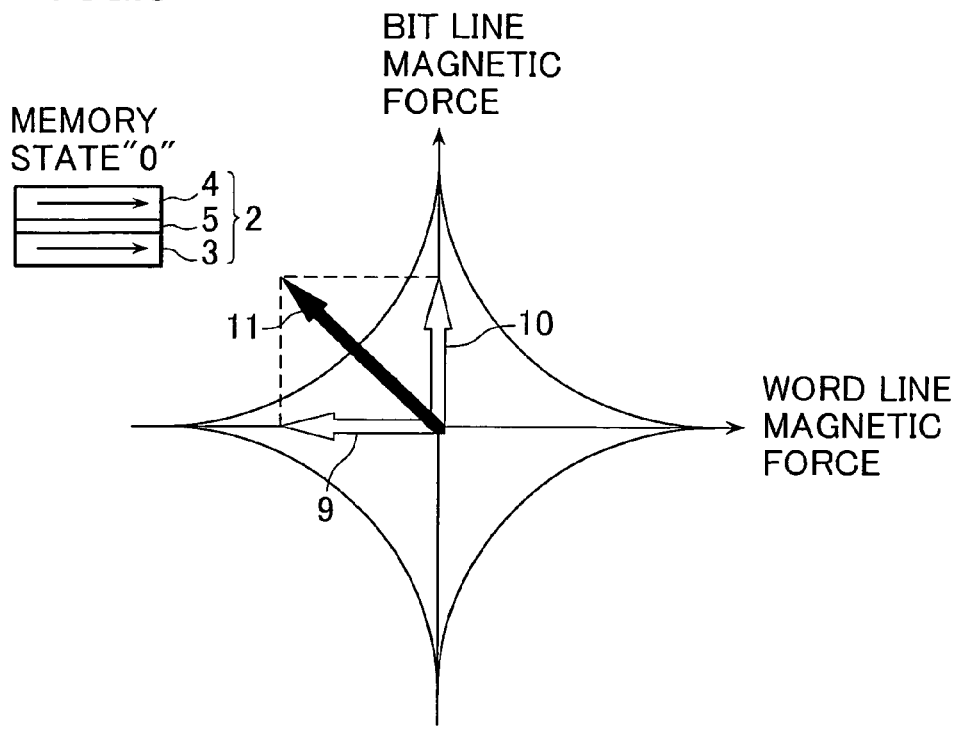
FIG. 5 is an illustration of a memory state (in a case when a combined magnetic force is directed upper leftward).

It is to be noted here, in order to store the memory state "0", the cast is not limited to the case as described hereinabove, in which the combined magnetic force 11 in the upper rightward direction is generated by the word line magnetic force 9 in the positive direction and the bit line magnetic force 10 in the positive direction (as shown in FIG. 4), but there may be also the case in which the combined magnetic force 11 in the upper leftward direction is generated by the word line magnetic force 9 in the negative direction and the bit line magnetic force 10 in the positive direction as shown in FIG. 5. Similarly, in order to store the memory state "1" in the ferromagnetic tunnel junction device 2, the combined magnetic force 11 in the rightward direction may be generated by the word line magnetic force 9 in the positive direction and the bit line magnetic force 10 in the negative direction as shown in FIG. 6, or alternatively, the case in which the combined magnetic force 11 in the leftward down direction may be generated by the word line magnetic force 9 in the negative direction and the bit line magnetic force 10 in the negative direction as shown in FIG. 7.

And conventionally, in the case of writing memory state "0" or "1" in the ferromagnetic tunnel junction device 2, the current flowing through the word line 7 is maintained always in the fixed positive direction so as to generate the word line magnetic force 9 always in the fixed direction, while under this condition, only the current flowing through the bit line 8 is inverted in the positive direction or in the negative direction so as to invert the bit line magnetic force 10, thereby changing the magnetization direction of the combined magnetic force 11 of the word line magnetic force 9 and the bit line magnetic force 10.

Figure 6:
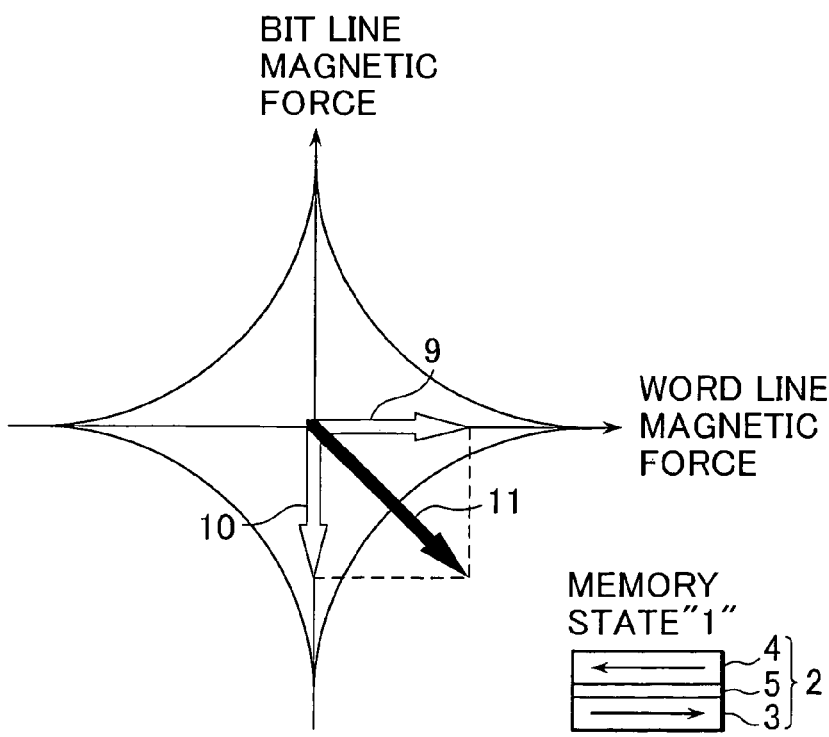
FIG. 6 is an illustration of a memory state (in a case when a combined magnetic force is directed to the down rightward).
Figure 7:
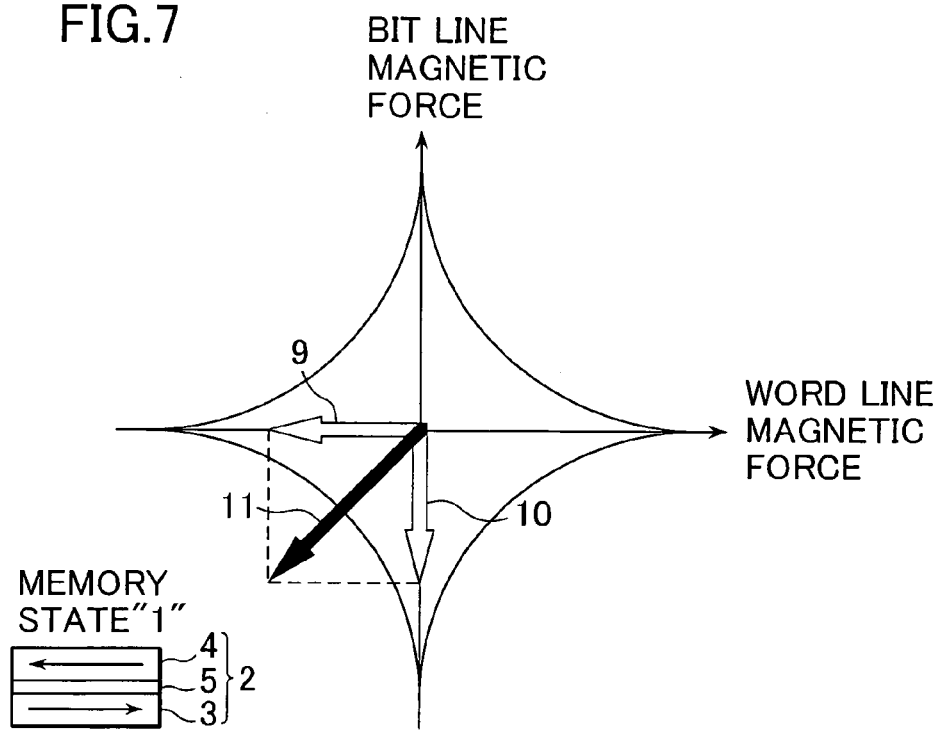
FIG. 7 is an illustration of the memory state (in a case when a combined magnetic force is directed to the down leftward).

That is, in the case of storing the memory state "0" in the ferromagnetic tunnel junction device 2 in the conventional technique, the combined magnetic force 11 in the upper rightward direction is generated by the word line magnetic force 9 in the positive direction and the bit line magnetic force 10 in the positive direction as shown in FIG. 4, while in the case of storing the memory state "1" in the ferromagnetic tunnel junction device 2, the combined magnetic force 11 in the rightward down direction is generated by the word line magnetic force 9 in the positive direction and the bit line magnetic force 10 in the negative direction as shown in FIG. 6.

For that reason, in the conventional technique, a current as large as several tens of milliamperes always continues to flow through the word line 7 in the positive direction at the time of writing in the ferromagnetic tunnel junction device 2, thereby causing generation of the constant potential difference between the word line 7 and the semiconductor substrate 6 at the periphery thereof. As a result, electromigration tends to occur in the word line 7 by the potential difference, and it causes short-circuiting between adjacent word lines 7, destroying the word lines 7 or the like and also leads to the possibility of inocurring troubles in the magnetic storage apparatus 1.

Therefore, in the present invention, the direction of the current flowing through the word line 7 at the time of writing the ferromagnetic tunnel junction device 2 is inverted in the same direction as the magnetization direction of the fixed magnetization layer 3 or inverted in the opposite direction thereto.

That is, in the case of storing the memory state "0" in the ferromagnetic tunnel junction device 2, the combined magnetic force 11 in the upper rightward direction is generated by the word line magnetic force 9 in the positive direction and the bit line magnetic force 10 in the positive direction as shown in FIG. 4. On the other hand, in the case of writing the memory state "1" in the ferromagnetic tunnel junction device 2, the combined magnetic force 11 in the leftward down direction is generated by the word line magnetic force 9 in the negative direction and the bit line magnetic force 10 in the negative direction as shown in FIG. 7.

The way of inverting the direction of the current flowing through the word line 7 in the same direction as or the opposite direction to the magnetization direction of the fixed magnetization layer 3 at the time of writing in the ferromagnetic tunnel junction device 2 does not have to be limited to the above combination (the combination of the conditions as shown in FIG. 4 and FIG. 7). In order to store the memory state "0" in the ferromagnetic tunnel junction device 2, it may be generated the combined magnetic force 11 in the upper leftward direction by the word line magnetic force 9 in the negative direction and the bit line magnetic force 10 in the positive direction as shown in FIG. 5, on the other hand, in order to store the memory state "1" in the ferromagnetic tunnel junction device 2, it may be generated the combined magnetic force 11 in the rightward direction by the word line magnetic force 9 in the positive direction and the bit line magnetic force 10 in the negative direction as shown in FIG. 6.

Also, in the above described two ways of inverting the direction of the current flowing through the word line 7, although the direction of the current flowing through the word line 7 is inverted depending on whether the memory state in the ferromagnetic tunnel junction device 2 is "0" or "1", the invention does not have to be limited to such example and it may be possible to invert the direction of the current flowing through the word line 7 at every time of writing in the ferromagnetic tunnel junction device 2.

That is, in the case of storing the memory state "0" in the ferromagnetic tunnel junction device 2 for the first time, the combined magnetic force 11 in the upper rightward direction is generated by the word line magnetic force 9 in the positive direction and the bit line magnetic force 10 in the positive direction as shown in FIG. 4. Then, in the case of subsequently storing the memory state "0" in the ferromagnetic tunnel junction device 2, the combined magnetic force 11 in the upper leftward direction is generated by the word line magnetic force 9 in the negative direction and the bit line magnetic force 10 in the positive direction as shown in FIG. 5. And, in the case of further subsequently storing the memory state "0" in the ferromagnetic tunnel junction device 2, the combined magnetic force 11 in the upper rightward direction may be generated again by the word line magnetic force 9 in the positive direction and the bit line magnetic force 10 in the positive direction as shown, in FIG. 4.

The above may be similar in the case of continuously storing the memory state "1" in the ferromagnetic tunnel junction device 7. Concretely, in the case of storing the memory state "1" in the ferromagnetic tunnel junction device 2 for the first time, the combined magnetic force 11 in the rightward direction is generated by the word line magnetic force 9 in the positive direction and the bit line magnetic force 10 in the negative direction as shown in FIG. 6. Then, in the case of subsequently storing the memory state "1" in the ferromagnetic tunnel junction device 2, the combined magnetic force 11 in the leftward direction is generated by the word line magnetic force 9 in the negative direction and the bit line magnetic force 10 in the negative direction as shown in FIG. 7. And, in the case further subsequently storing the memory state "1" in the ferromagnetic tunnel junction device 2, the combined magnetic force 11 in the rightward down direction is again generated by the word line magnetic force 9 in the positive direction and the bit line magnetic force 10 in the negative direction as shown in FIG. 6.

By inverting the direction of the current flowing through the word line 7 in the same direction as or the opposite direction to the magnetization direction of the fixed magnetization layer 3 at the time of writing in the ferromagnetic tunnel junction device 2, the direction of the current flowing through the word line 7 is not always fixed but is inverted with time, thereby changing the current flowing through the word line 7 into a quasi-alternating current. Accordingly, the potential difference generated between the word line 7 and the peripheral semiconductor substrate 6 is inverted with time, thereby effectively preventing the electromigration generation due to the constant potential difference generation. As a result, it is possible to improve resistance to electromigration without increasing the width of word lines 7, which increases the size of the magnetic storage apparatus 1, and to extend the lifetime of the magnetic storage apparatus 1 by preventing troubles in the magnetic storage apparatus 1.

Particularly, in the case of inverting the direction of the current flowing through the word line 7 at every time of writing in the ferromagnetic tunnel junction device 2, it is possible to minimize the time to generate the constant potential difference between the word line 7 and the peripheral semiconductor substrate 6, thereby effectively preventing electromigration from occurring and further enhancing resistance to electromigration.

Next, means for changing the magnetization direction of the word line magnetic force 9 and the bit line magnetic force 10 described hereinabove will be described. In order to change the magnetization directions of the word line magnetic force 9 and the bit line magnetic force 10, the directions of the currents flowing through the word line 7 and the bit line 8 are changed, and a circuit for such purpose is shown in FIG. 8.

Figure 8:
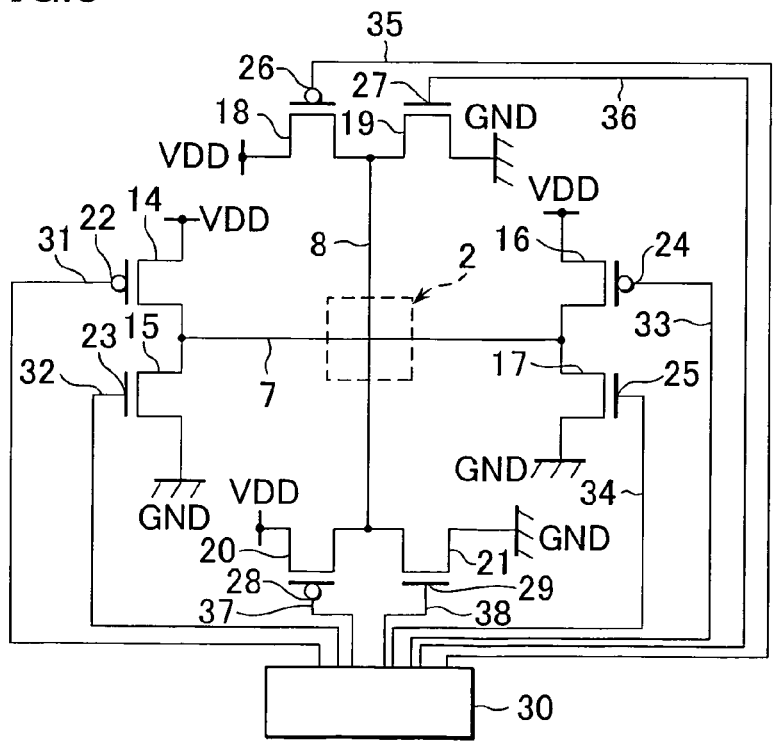
FIG. 8 is a circuit schematic of a circuit for inverting a direction of a current flowing through a bit line or a word line.

As shown in FIG. 8, the left end of the word line 7 is coupled to a P type FET 14 that is connected to a power supply VDD and to a N type FET 15 that is connected to the ground GND while the right end of the word line 7 is coupled to a P type FET 16 which is connected to the power supply VDD and to a N type FET 17 that is connected to the ground GND. On the other hand, a back end of the bit line 8 is coupled to a P type FET 18 which is connected to the power supply VDD and to a N type FET 19 which is connected to the ground GND while a front end of the bit line 8 is coupled to a P type FET 20 which is connected to the power supply VDD and to a N type FET 21 which is connected to the ground GND. The device electrodes 22, 24, 26, 28 of these P type FETs 14, 16, 18, 20 and the device electrodes 23, 25, 27, 29 of these N type FETs 15, 17, 19, 21 are connected to a control circuit 30 so that the P type FETs 14, 16, 18, 20 and the N type FETs 15, 17, 19, 21 function as switching transistors.

And control signals 31–38 are inputted to the device electrodes 22–29 from the control circuit 30 for selectively switching the P type FETs 14, 16, 18, 20 and the N type FETs 15, 17, 19, 21, thereby inverting the direction of the currents flowing through the word line 7 and the bit line 8.

Concretely, inputting of the control signals 31, 34 to the device electrode 22 of the P type FET 14 and to the device electrode 25 of the N type FET 17 from the control circuit 30 causes the P type FET 14 and the N type FET 17 to turn on while inputting of the control signals 32, 33 to the device electrode 23 of the N type FET 15 and to the device electrode 24 of the P type FET 16 causes the N type FET 15 and the P type FET 16 turn off, thereby connecting the left end of the word line 7 to the power supply VDD and connecting the right end of the word line 7 to the ground GND. This causes the current through the word line 7 to flow right from the left end to the right end. On the other hand, when the P type FET 14 and the N type FET 17 are turned off while the N type FET 15 and the P type FET 16 are turned on by the control circuit 30, the left end of the word line 7 is connected to the ground GND while the right end of the word line 7 is connected to the power supply VDD, thereby causing the current through the word line 7 to flow left from the right end to the left end.

Likewise, from the control circuit 30, the control signals 35, 38 are inputted to the device electrode 26 of the P type FET 18 and to the device electrode 29 of the N type FET 21 for turning on the P type FET 18 and the N type FET 21 while the control signals 36, 37 are inputted to the device electrode 27 of the N type FET 19 and to the device electrode 28 of the P type FET 20 for turning off the N type FET 19 and the P type FET 20, thereby connecting the upper end of the bit line 8 to the power supply VDD and connecting the lower end of the bit line 8 to the ground GND and causing the current to flow downwardly through the bit line 8 from the upper end to the lower end. On the other hand, by the control circuit 30, when the P type FET 18 and the N type FET 21 are turned off while the P type FET 20 and the N type FET 19 are turned on, the upper end of the bit line 8 is connected to the ground GND while the lower end of the bit line 8 is connected to the power supply VDD, thereby causing the current to flow upwardly through the bit line 8 from the lower end to the upper end.

Figure 9:
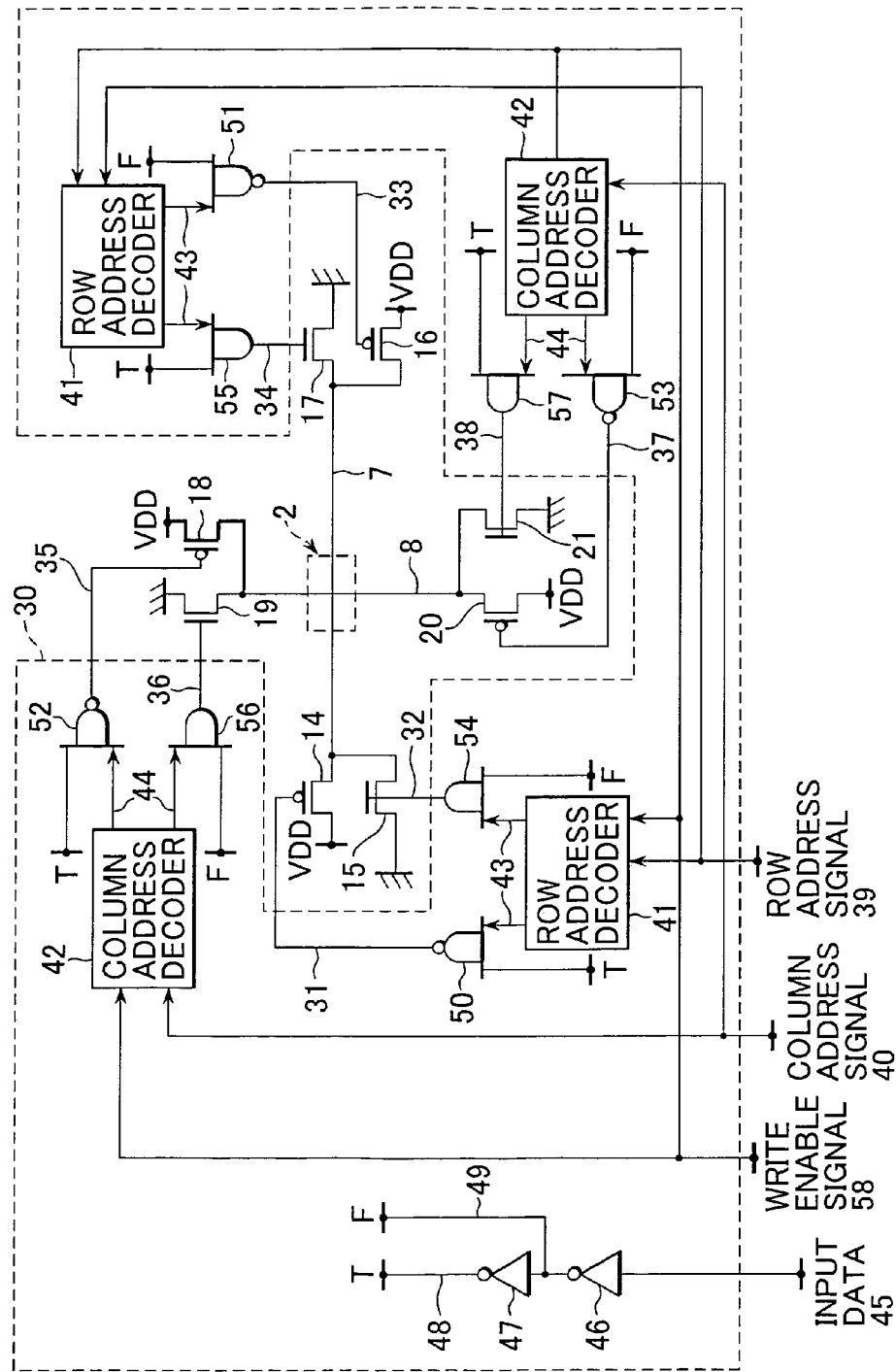
FIG. 9 is a circuit schematic of a control circuit.

Next, one example of the control circuit 30 is shown in FIG. 9. The control circuit 30 is a circuit for inverting the direction of the currents flowing through the bit line 8 and the word line 7 depending on whether the memory state that is stored in the ferromagnetic tunnel junction device 2 is "0" or "1".

In FIG. 9, address decode signals 43, 44 are generated by decoding a row address signal 39 and a column address signal 40, which represent storage locations of the ferromagnetic tunnel junction devices 2 by a row address decoder 41 and a column address decoder 42, respectively. On the other hand, a true signal 48, which represents the input data 45 itself and a false signal 49 which is inversion of the input data 45 are generated by using a pair of inverter devices 46, 47 from the input data 45 to be stored in the ferromagnetic tunnel junction devices 2. The control signals 31–38 are generated from combinations of the address decode signals 43, 44, the true signal 48 and the false signal 49 by using NAND devices 50–53 and AND devices 54–57. In the drawing, represented by 58 is a write enable signal.

And a particular ferromagnetic tunnel junction device 2 is designated by the row address signal 39 and the column address signal 40. When the write enable signal 58 becomes active (referred to as "1" herein), the address decode signals 43, 44 become active (referred to as "1" herein) by the row address decoder 41 and the column address decoder 42.

At this time, when the input data 45 is "0", the true signal 48 is also "0" by means of the two inverter devices 46, 47, while the false signal 49 is "1" by means of the inverter device 46. Accordingly, the control signal 31 is "1" by means of a NAND device 50, thereby turning off the P type FET 14. The control signal 32 is "1" by means of a -AND device 54, thereby turning on the N type FET 15, while the control signal 33 is "0" by means of a NAND device 51, thereby turning on the P type FET 16. The control signal 34 is "0" by means of an AND device 55, thereby turning off the N type FET 17. As a result, the left end of the word line 7 is connected to the ground GND while the right end of the word line 7 is connected to the power supply VDD, thereby causing the current to flow leftward through the word line 7 from the right end to the left end. The current flowing through the bit line 8 is controlled in a manner similar to the above.

The above operation of the circuit as shown and described by reference to FIG. 9 is shown in a timing chart in FIG. 10. It is shown in FIG. 10 that the leftward current flow through the word line 7 is "0", the rightward current flow through the word line 7 is "1", the forward current flow through the bit line 8 is "0" and the backward current flow through the bit line 8 is "1".

As shown in FIG. 10, when the input data 45 is "0", the true signal 48 is "0" while the false signal 49 is "1". Under this condition, when the write enable signal 58 becomes active (referred to as "1" herein), the leftward current flows through the word line 7 and the upward current flows through the bit line 8 of the particular ferromagnetic tunnel junction device 2 which is designated by the effective row address signal 39 and column address signal 40.

Then, when the input data 45 is inverted from "0" to "1", the true signal 48 is "1" and the false signal 49 is "0". Under this condition, when the write enable signal 58 becomes active (referred to as "1" herein), the current flowing through the word line 7 is inverted from the leftward direction to the rightward direction while the current flowing through the bit line 8 is inverted from the upward direction to the downward direction, of the particular ferromagnetic tunnel junction device 2 that is designated by the effective row address signal 39 and column address signal 40.

As described hereinabove, the direction of the current flowing through not only the word line 7 but also the bit line 8 is inverted depending on whether the memory state that is to be stored in the ferromagnetic tunnel junction device 2 is "0" or "1".

It is to be noted that, by appropriate design of the control circuit 30, the direction of the current flowing through the word line 7 can be inverted at every time of writing in the ferromagnetic tunnel junction device 2, the direction of the current flowing through the word line 7 can be inverted after plural times of continuous writing, the direction of the current flowing through the word line 7 can be inverted at every designated time, or further the direction of the current flowing through the word line 7 can be inverted even in a single writing.

INDUSTRIAL APPLICABILITY

The present invention can be practiced in the embodiment that has been described hereinabove and provides advantages that will be described hereunder.

That is, in the present invention, since the direction of the current flowing through the word line is inverted in the same direction as or the opposite direction to the magnetization direction of the fixed magnetization layer at the time of writing in the ferromagnetic tunnel junction device, the direction of the current flowing through the word line is not always fixed but inverted with time, thereby making the current flowing through the word line quasi-alternating and inverting the potential difference with time, which is generated between the word line and the peripheral semiconductor substrate. As a result, electromigration due to generation of the constant potential difference is prevented and thus resistance to electromigration is improved without increasing the width of the word lines and increasing the size of the magnetic storage apparatus, and therefore, the lifetime of the magnetic storage apparatus is extended by preventing troubles therein.

In particular, if the direction of the current flowing through the word line is inverted at every time of writing in the ferromagnetic tunnel junction device, generation of the constant potential difference between the word line and the peripheral semiconductor substrate can be minimized, thereby more effectively preventing electromigration from occurring and further enhancing resistance to electromigration.

The invention claimed is:

1. A magnetic storage apparatus using a ferromagnetic tunnel junction device, comprising:
   a ferromagnetic tunnel junction device configured with
      a fixed magnetization layer,
      a free magnetization layer, and
      a tunnel barrier layer disposed between said fixed magnetization layer and said free magnetization layer;
   a word line wired in a magnetization direction of said fixed magnetization layer of said ferromagnetic tunnel junction device;
   a bit line wired in an orthogonal direction to said magnetization direction of said fixed magnetization layer of said ferromagnetic tunnel junction device;
   writing means for writing two different memory states in said ferromagnetic tunnel junction device by inverting a current flowing through said bit line; and
   inverting means for inverting a direction of current flowing through said word line in a same direction as or an opposite direction to said magnetization direction of said fixed magnetization layer at the time of writing in said ferromagnetic tunnel junction device.

2. The magnetic storage apparatus using said ferromagnetic tunnel junction device according to claim 1, said inverting means for inverting said direction of current flowing through said word line inverts said direction of current flowing through said word line at every time of writing in said ferromagnetic tunnel junction device.

* * * * *